United States Patent [19]

Toyoda et al.

[11] Patent Number: 6,069,378
[45] Date of Patent: May 30, 2000

[54] PHOTO SENSOR INTEGRATED CIRCUIT

[75] Inventors: Inao Toyoda; Yasutoshi Suzuki, both of Okazaki; Keijiro Inoue, Tosu, all of Japan

[73] Assignee: Denso Corporation, Kariya, Japan

[21] Appl. No.: 08/985,043

[22] Filed: Dec. 4, 1997

[30] Foreign Application Priority Data

Dec. 5, 1996 [JP] Japan ..................................... 8-325236

[51] Int. Cl.⁷ ....................... H01L 31/062; H01L 31/113; H01L 31/0203; H01L 31/0232
[52] U.S. Cl. ......................... 257/294; 257/292; 257/434; 257/435; 428/57; 428/73
[58] Field of Search .................. 257/292, 293, 257/294, 434, 435, 463; 438/57, 73

[56] References Cited

U.S. PATENT DOCUMENTS

| | | | |
|---|---|---|---|
| 5,040,039 | 8/1991 | Hattori et al. | 257/463 |
| 5,061,978 | 10/1991 | Mizutani et al. | |
| 5,101,253 | 3/1992 | Mizutani et al. | |
| 5,268,309 | 12/1993 | Mizutani et al. | |
| 5,602,384 | 2/1997 | Nunogaki et al. | |
| 5,614,741 | 3/1997 | Harada et al. | 257/233 |
| 5,877,830 | 3/1999 | Shimada et al. | 349/113 |

FOREIGN PATENT DOCUMENTS

| | | |
|---|---|---|
| 59-134872 | 8/1984 | Japan . |
| 61-61457 | 3/1986 | Japan . |
| 62-202556 | 9/1987 | Japan . |
| 63-116458 | 5/1988 | Japan . |
| 3-237757 | 10/1991 | Japan ..................................... 257/294 |

*Primary Examiner*—Mahshid Saadat
*Assistant Examiner*—Allan R. Wilson
*Attorney, Agent, or Firm*—Pillsbury Madison & Sutro LLP

[57] ABSTRACT

A photo diode and a signal processing circuit are formed on a silicon substrate. The signal processing circuit comprises a PNP transistor and an NPN transistor. A region of the signal processing circuit on the silicon substrate is covered by an aluminum thin film functioning as a shielding film. A covered distance L($\mu$m) is defined as an overhang of the aluminum thin film from the edge of the PNP transistor, and is determined based on a ratio of a minimum current of the PNP transistor, which induces malfunction in the signal processing circuit under the solar radiation, to a current generated in the circuit element when subjected to the solar radiation without the aluminum thin film.

6 Claims, 15 Drawing Sheets

PHOTO SENSOR INTEGRATED CIRCUIT

BACKGROUND OF THE INVENTION

The present invention relates to a photo sensor integrated circuit in which light is received by a light receiving element (e.g., photo diode) and is converted into photoelectric current by a photoelectric transfer device. The photoelectric current is then processed in a signal processing circuit (e.g., transistors). The photoelectric transfer device and the signal processing circuit are integrated as one chip semiconductor component.

FIG. 15 shows a conventional photo sensor integrated circuit providing a shielding film 51 on the circuit element (NPN transistor) 50 to eliminate malfunction of the circuit which may be induced by incoming light (refer to Unexamined Japanese Patent Application No. 63-116458, published in 1988).

However, this kind of photo sensor has a possibility of causing malfunction when subjected to strong light equivalent to the solar radiations because the solar radiations usually produce photo carriers which flow as current in the vicinity of the circuit element.

SUMMARY OF THE INVENTION

In view of the above-described problems, the present invention has an object of providing a novel and excellent photo sensor integrated circuit capable of eliminating malfunction of the circuit which may be induced by the incoming light.

In order to accomplish this and other related objects, a first aspect of the present invention provides a photo sensor integrated circuit comprising photoelectric transfer means for converting received light into photoelectric current when subjected to solar radiation, signal processing means for processing the photoelectric current of the photoelectric transfer means, and a semiconductor substrate for integrating the photoelectric transfer means and the signal processing means as one chip component. The semiconductor substrate includes a shielding film covering a circuit element functioning as the signal processing means. A covered distance is defined as an overhang of the shielding film from an edge of the circuit element and is determined based on a ratio of a minimum current of the circuit element, which induces malfunction in the signal processing means under the solar radiation, to a current generated in the circuit element when subjected to the solar radiation without the shielding film.

According to the above-described arrangement, the overhang of the shielding film (i.e. the covered distance L) is determined considering the influence of photo carriers caused by strong light equivalent to solar radiations irradiating the uncovered substrate. Thus, the malfunction of the circuit can be eliminated.

A second aspect of the present invention provides a photo sensor integrated circuit comprising photoelectric transfer means for converting received light into photoelectric current when subjected to solar radiation, signal processing means for processing the photoelectric current of the photoelectric transfer means, and a semiconductor substrate for integrating the photoelectric transfer means and the signal processing means as one chip component. The semiconductor substrate includes a shielding film covering a circuit element functioning as the signal processing means. A covered distance L ($\mu$m) is defined as an overhang of the shielding film from an edge of the circuit element and satisfies the following relationship $$L > \frac{\log\left(3.17 \times 10^{-6} \times \frac{Imal(\min)}{Io}\right) + 6.35}{-0.0704}$$

where Io represents a current generated in the circuit element when subjected to 100,000 lux light irradiation without the shielding film, while Imal(min) represents a minimum current of the circuit element which induces malfunction in the signal processing means under the 100,000 lux light irradiation.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Figure 1:
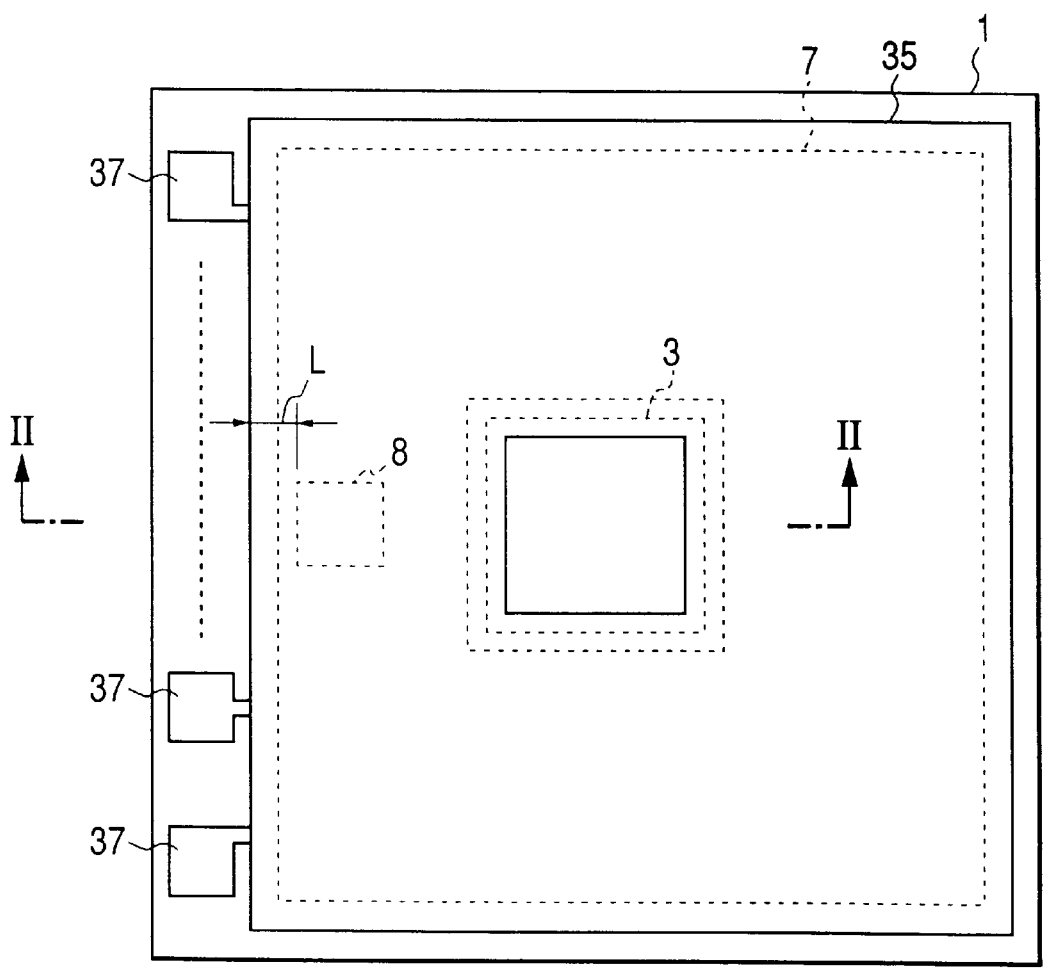
FIG. 1 is a plan view showing a photo sensor integrated circuit in accordance with a first embodiment of the present invention.

Preferred embodiments of the present invention will be explained hereinafter with reference to accompanied drawings. Identical parts are denoted by the same reference numerals throughout the drawings.

First embodiment

Figure 2:
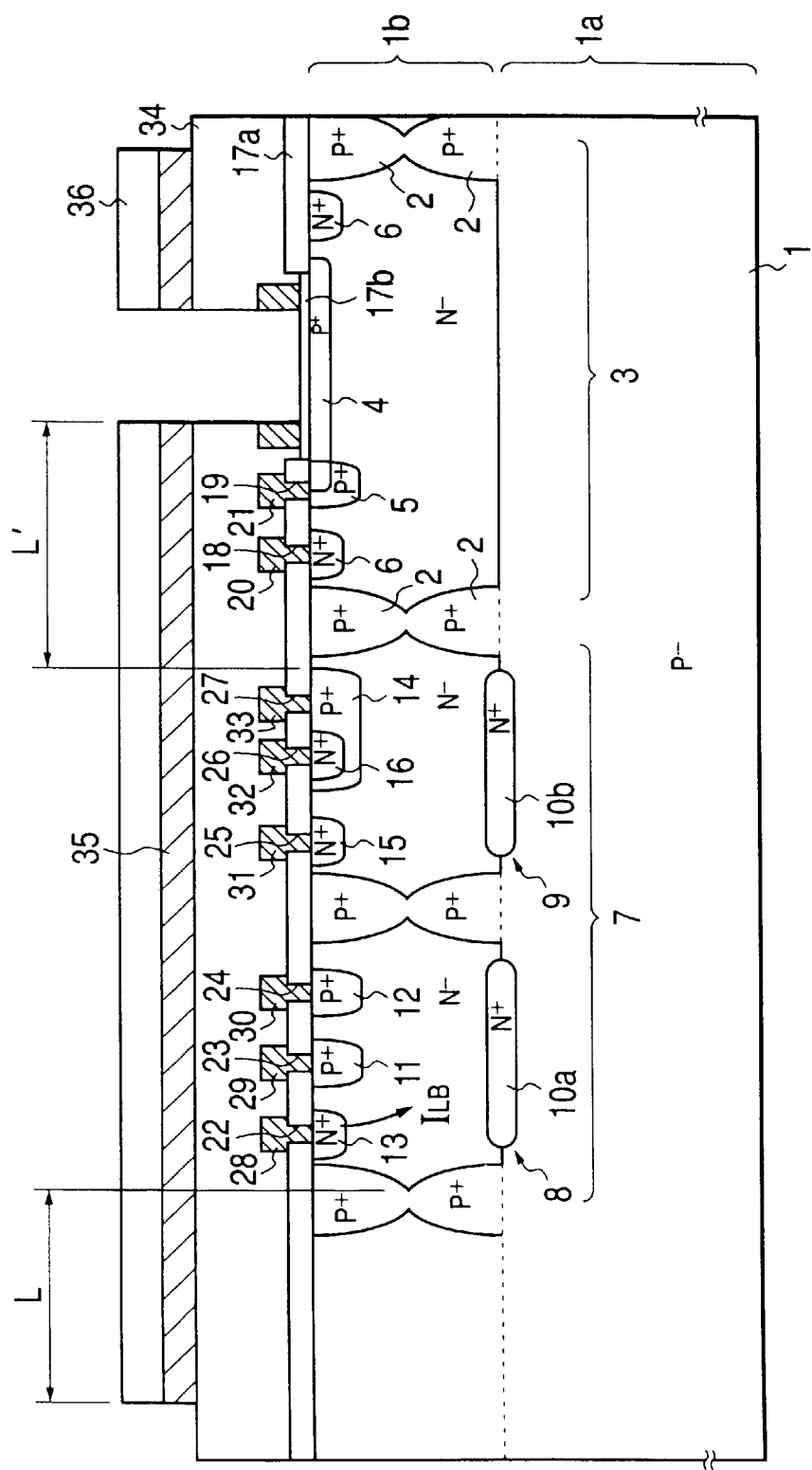
FIG. 2 is a cross-sectional view taken along a line II—II of FIG. 1.

FIG. 1 is a plan view showing a photo sensor integrated circuit in accordance with a first embodiment of the present invention, and FIG. 2 is a cross sectional view taken along a line II—II of FIG. 1.

The photo sensor integrated circuit of the present invention is, for example, used as a solar sensor which is preferably employed in an air-conditioning apparatus of an automotive vehicle for controlling the temperature of a passenger compartment in the automotive vehicle.

More specifically, the photo sensor integrated circuit is installed on or in the vicinity of an upper surface of an instrument panel of the automotive vehicle. The current flowing across the photo sensing element varies depending on a quantity of received light. The temperature of the passenger compartment is controlled based on the current of the photo sensor.

The photo sensor integrated circuit is also used as a light sensor which is preferably employed in auto-lightening system for automatically turning on or off the vehicle lights, such as headlights and taillights, in response to darkness around the vehicle.

In short, the photo sensor integrated circuit of the present invention is operative in any environment capable of receiving solar radiation.

As shown in FIGS. 1 and 2, in a photo sensor integrated circuit, a silicon substrate 1 functioning as a semiconductor substrate comprises a P⁻type silicon substrate 1a and an N⁻type epitaxial layer 1b arranged on the P⁻type silicon substrate 1a. A photo diode device 3 isolated by a P⁺type region 2 is arranged in the central portion of the silicon substrate 1 and functioning as a photoelectric transfer device. In the photo diode device 3, P⁺type region 4 is arranged in a surface portion of the N⁻type epitaxial layer 1b and functioning as a light receiving element, and a P⁺type region 5 is arranged in a peripheral portion of the P⁺type region 4. Also, in the photo diode device 3, an N⁺type region 6 formed in a ring shape is arranged in the N⁻type epitaxial layer 1b to surround the P⁺type region 4.

A signal processing circuit device 7 is arranged in the silicon substrate 1 to surround the photo diode device 3, forming one chip of the photo diode device 3 and the signal processing circuit device 7. A large number of semiconductor devices are arranged in the signal processing circuit device 7. A signal amplifying circuit and an A/D converting circuit are composed of the semiconductor devices. As an example, a PNP bipolar transistor 8 and an NPN bipolar transistor 9 are shown in FIG. 2. That is, an N⁺type buried layer 10a is arranged in a boundary portion between the P⁻type silicon substrate 1a and the N⁻type epitaxial layer 1b. A pair of P⁺type regions 11 and 12 and an N⁺type region 13 are arranged in a surface layer portion of the N⁻type epitaxial layer 1b. Therefore, the PNP bipolar transistor 8 comprises the P⁺type regions 11 and 12 and the N⁺type region 13. Also, an N⁺type buried layer 10b is arranged in a boundary portion between the P⁻type silicon substrate 1a and the N⁻type epitaxial layer 1b. And, a P⁺type region 14 and an N⁺type region 15 are arranged in a surface layer portion of the N⁻type epitaxial layer 1b. Furthermore, an N⁺type region 16 is arranged in the P⁺type region 14. Therefore, the NPN bipolar transistor 9 comprises the P⁺type region 14 and the N⁺type regions 15 and 16.

A silicon oxide film 17a is arranged on an upper surface of the silicon substrate 1. The silicon oxide film 17a is opened on the photo diode device 3. A thin silicon oxide film 17b denoting a first insulating film is arranged in the opening portion of the silicon oxide film 17a to be placed on the P⁺type region 4 functioning as the light receiving element of the photo diode device 3. The silicon oxide film 17b is formed by performing a thermal oxidation processing for an upper surface of the silicon substrate 1 exposed to the opening portion. It is preferred that a film thickness of the silicon oxide film 17b ranges from 1,000 to 3,000 Å. In this embodiment, a film thickness of the silicon oxide film 17b is 1,100 Å.

Also, a pair of opening portions 18 and 19 are formed in the silicon oxide film 17a of the photo diode device 3. An aluminum wire 20 is electrically connected with the N⁺type region 6 through the opening portion 18. An aluminum wire 21 is electrically connected with the P⁺type region 5 through the opening portion 19. The aluminum wires 20 and 21 are respectively formed by patterning an aluminum thin film in a desired shape.

In addition, a plurality of openings 22, 23, 24, 25, 26 and 27 are formed in the silicon oxide film 17a of the signal processing circuit device 7. The opening portions 22 to 27 are buried with a plurality of aluminum wires 28, 29, 30,31,32 and 33. The aluminum wire 28 is electrically connected with the N⁺type region 13 through the opening portion 22. The aluminum wire 29 is electrically connected with the P⁺type region 11 through the opening portion 23. The aluminum wire 30 is electrically connected with the P⁺type region 12 through the opening portion 24. The aluminum wire 31 is electrically connected with the N⁺type region 15 through the opening portion 25. The aluminum wire 32 is electrically connected with the N⁺type region 16 through the opening portion 26. And, the aluminum wire 33 is electrically connected with the P⁺type region 14 through the opening portion 27. The aluminum wires 28 and 33 are respectively formed by patterning an aluminum thin film in a desired shape.

An inter-layer insulating film 34 denoting a second insulating film is arranged on the silicon oxide film 17a to cover the aluminum wires 20, 21 and 28 to 33. The inter-layer insulating film 34 is obtained by laminating a silicon oxide film and a silicon nitride film and functions as a protective film placed on the signal processing circuit device 7. Also, an aluminum thin film 35 is arranged on the inter-layer insulating film 34 and functions as a shielding film. Furthermore, a surface protective film 36 made of silicon nitride is arranged on the aluminum thin film 35. The inter-layer insulating film 34, the aluminum thin film 35 and the surface protective film 36 are opened on the photo diode device 3 to receive light.

That is, when light is incident in the opening portion of the photo diode device 3, the light passes through the thin silicon oxide film 17b and reaches the P⁺type region 4 functioning as the light receiving element of the photo diode device 3. Thereafter, when the light is incident in the neighborhood of a PN junction between the N⁻type epitaxial layer 1b and the P⁺type region 4, a plurality of electrons and holes occur in pairs in the neighborhood of the PN junction. In this case, the electrons generated in the P⁺type region 4 as a minority carrier are moved toward the N⁻type epitaxial layer 1b, while the holes generated in the N⁻type epitaxial layer 1b as a minority carrier are moved toward the P⁺type region 4. Therefore, photoelectric current flows from the N⁻type epitaxial layer 1b to the P⁺type region 4. The intensity of this photoelectric current is proportional to the intensity of the incident light. The photoelectric current is transmitted to the signal processing circuit device 7 through the aluminum wires 20 and 21. Thereafter, the photoelectric current is amplified and converted into a digital signal in the signal processing circuit device 7. The digital signal is output to an outside device through one of a plurality of pads 37 shown in FIG. 1.

Hereinafter, a relationship relating to a covered distance L of the aluminum thin film 35 will be explained. The covered distance L represents an overhang of the aluminum thin film 35 from the edge of the PNP bipolar transistor 8 (more specifically, from the edge of the N⁻type epitaxial layer 1b).

The following inequality needs to be satisfied according to the present invention.

$$L > \frac{\log\left(3.17 \times 10^{-6} \times \frac{Imal(\min)}{Io}\right) + 6.35}{-0.0704}$$

where Io represents a current generated in the PNP bipolar transistor 8 (more specifically, base current of the N⁻type epitaxial layer transistor) when the PNP bipolar transistor 8 is subjected to 100,000 lux light irradiation under a condition where the aluminum thin layer 35 is not provided. Imal(min) represents a minimum current of the PNP bipolar transistor 8 which induces malfunction in the signal processing circuit device 7 under the 100,000 lux light irradiation.

Figure 12:
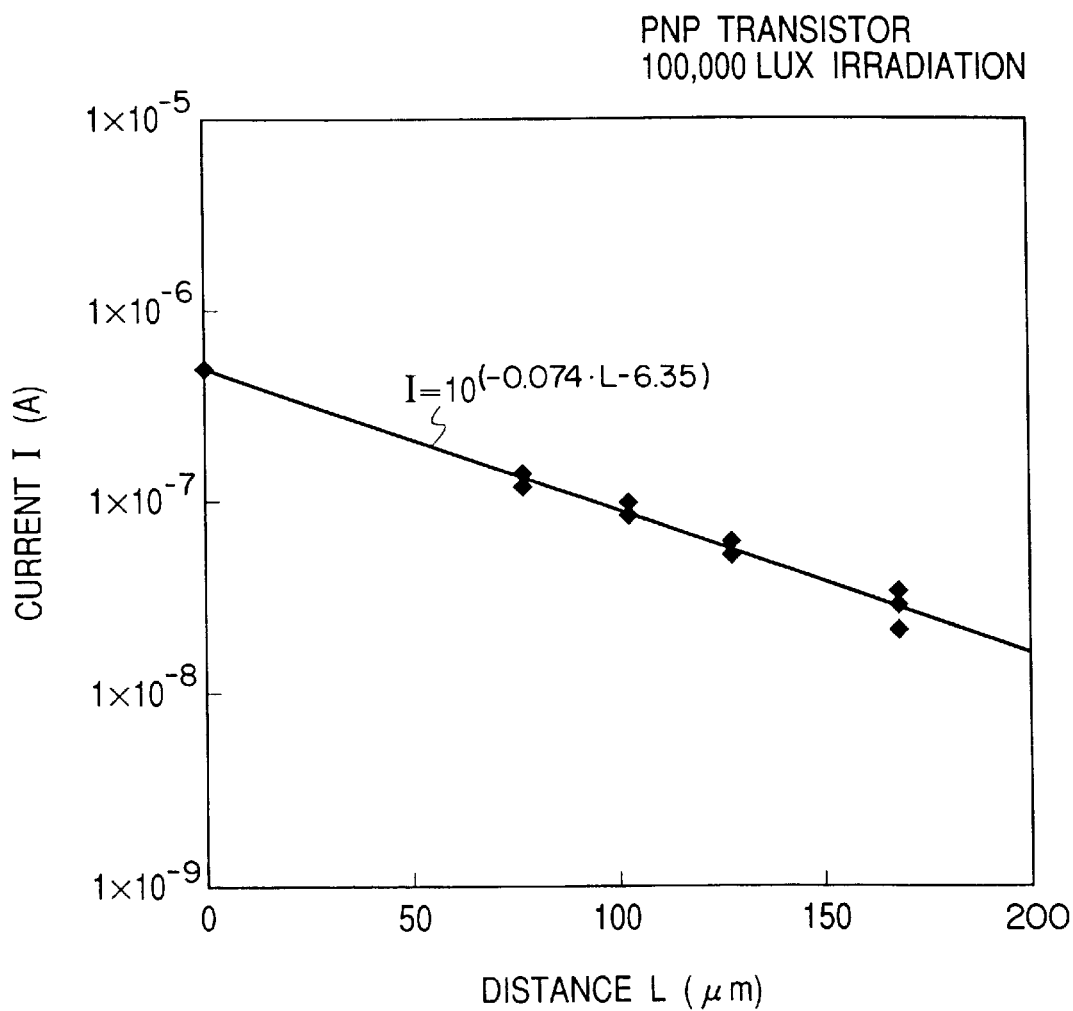
FIG. 12 is a graph showing measured result of current generated in a circuit element in relation to a covered distance of a shielding film.
Figure 13:
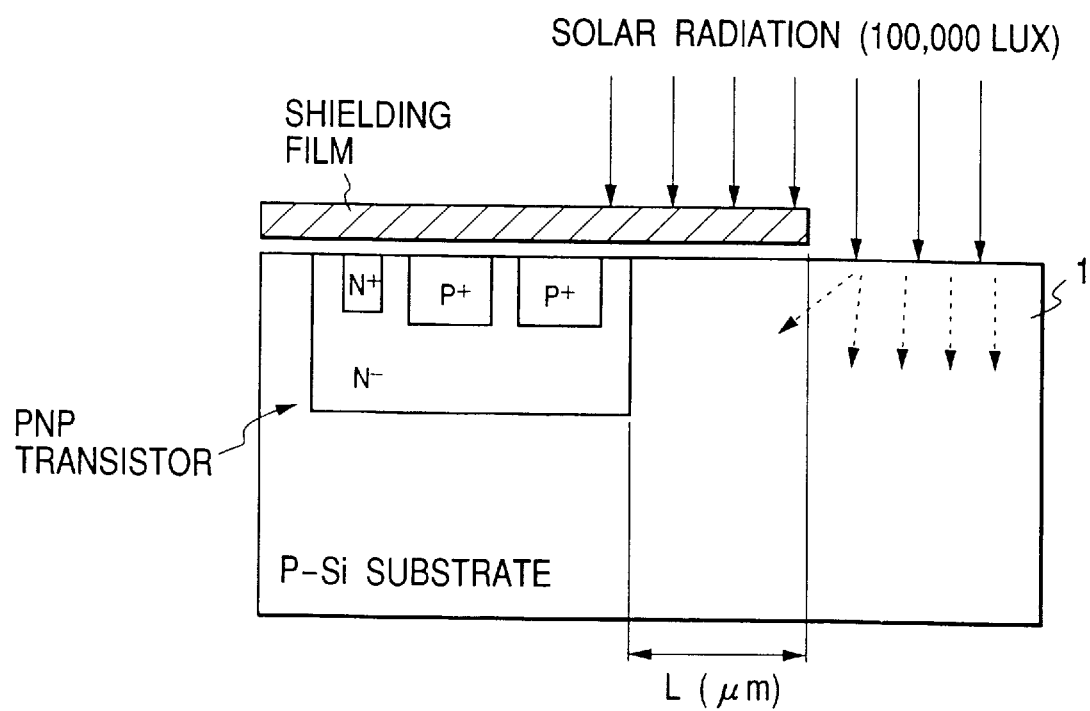
FIG. 13 is a cross-sectional view showing mechanism of current produced during the solar radiation.

FIG. 12 shows a measured result of the current generated in the N⁻type epitaxial layer 1b of the PNP bipolar transistor 8 when the 100,000 lux light serving as pseudo-solar radiation (Air MOS 1.5) is irradiated from directly above the PNP bipolar transistor 8. The current generated in the N⁻type epitaxial layer 1b of the PNP bipolar transistor 8 is measured several times by varying the covered distance L. In FIG. 12, an abscissa represents the covered distance L [μm] while a logarithmic ordinate represents generated current I [A]. The current of the PNP bipolar transistor 8 is chiefly generated by carriers produced due to the diffusion of incoming light in the silicon substrate 1 as shown in FIG. 13.

From the measured result of FIG. 12, the relationship between the generated current I [A] and the covered distance L [μm] is given by the following equation.

$$I = 10^{(-0.0704L - 6.35)} \tag{1}$$

The generated current flows as the leakage base current in the PNP bipolar transistor 8, causing the malfunction of the circuit. That is, in FIG. 2, the leakage base current $I_{LB}$ flows from the N⁺type region (base region) 13 to the N⁻type epitaxial layer 1b. When the leakage base current $I_{LB}$ exceeds a predetermined value Imal(min), the circuit causes the malfunction. Accordingly, to prevent the malfunction of the circuit, the element needs to satisfy the following relationship.

$$L > \frac{\log I + 6.35}{-0.00704} \, [\mu m]$$

The above-described generated current varies depending on the quantity of irradiated light.

When this circuit element (i.e., PNP bipolar transistor 8) is subjected to the 100,000 lux light irradiation serving as the pseudo-solar radiation under the condition where no shielding film is provided, current of $3.17 \times 10^{-6}$ [A] is obtained. This current is referred to as Io.

To prevent the circuit from malfunctioning, the following relationship needs to be satisfied.

$$\frac{Imal(\min)}{Io} > \frac{10^{(-0.0704 \cdot L - 6.35)}}{3.17 \times 10^{-6}}$$

The above inequality can be modified in the following manner.

$$L > \frac{\log\left(3.17 \times 10^{-6} \times \frac{Imal(\min)}{Io}\right) + 6.35}{-0.0704}$$

Next, a manufacturing method for manufacturing the photo sensor integrated circuit shown in FIGS. 1 and 2 will be described with reference to FIGS. 3 to 12.

Figure 3:
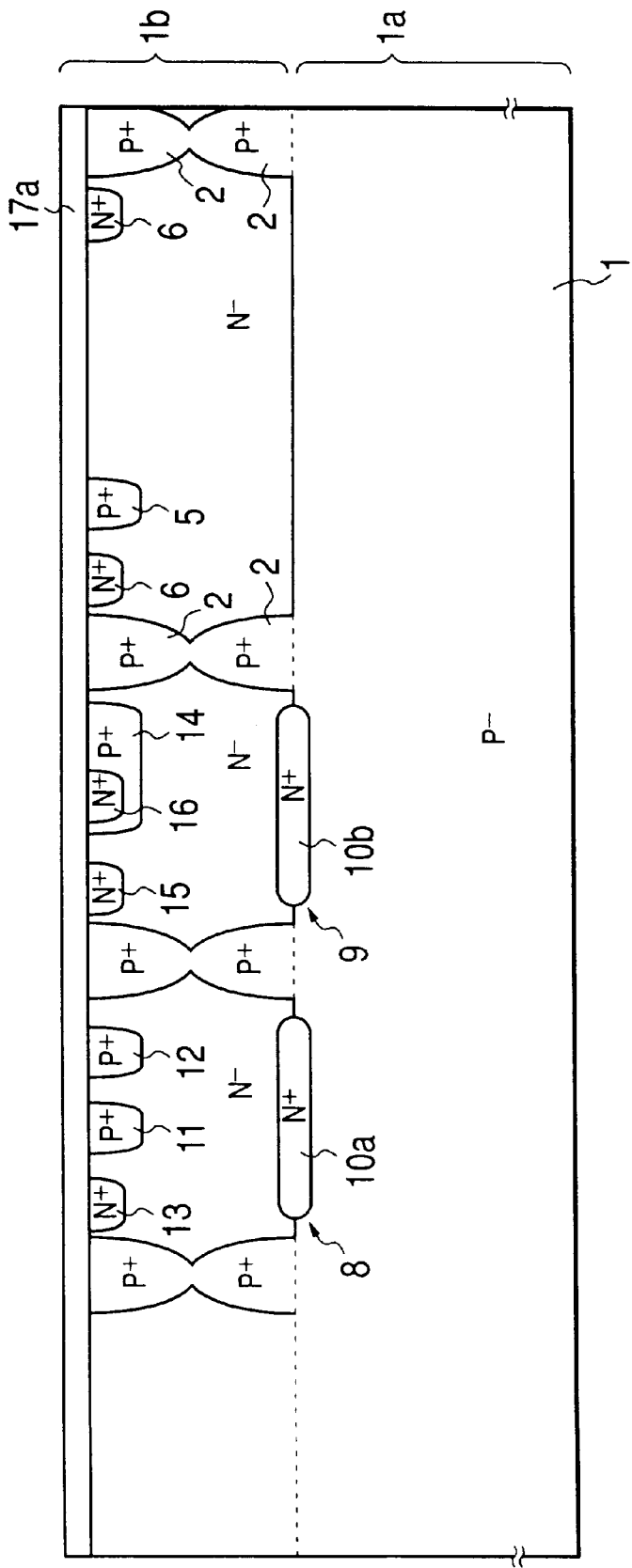
FIG. 3 is a cross-sectional view showing a manufacturing step of the photo sensor integrated circuit in accordance with the first embodiment of the present invention.

As shown in FIG. 3, a device, such as a transistor, a diffused resistor or the like, is formed on the silicon substrate 1 formed in the epitaxial growth process according to a diffusion method used for a normal integrated circuit manufacturing. In detail, the N⁻type epitaxial layer 1b is grown on the P⁻type silicon substrate 1a. In this case, the N⁺type buried layers 10a and 10b and the P⁺type region 2 placed on the buried side are simultaneously formed. Thereafter, ion injection and thermal processing are performed for an upper surface of the N⁻type epitaxial layer 1b. The P⁺type region 5, the N⁺type region 6, the P⁺type regions 11 and 12, the N⁺type region 13, the P⁺type region 14, the N⁺type regions 15 and 16 and the P⁺type region 2 for a device separation are formed in the N⁻type epitaxial layer 1b.

Thereafter, the silicon oxide film (or a thermal oxide film) 17a is formed on the upper surface of the silicon substrate 1 by thermal oxidation processing.

Figure 4:
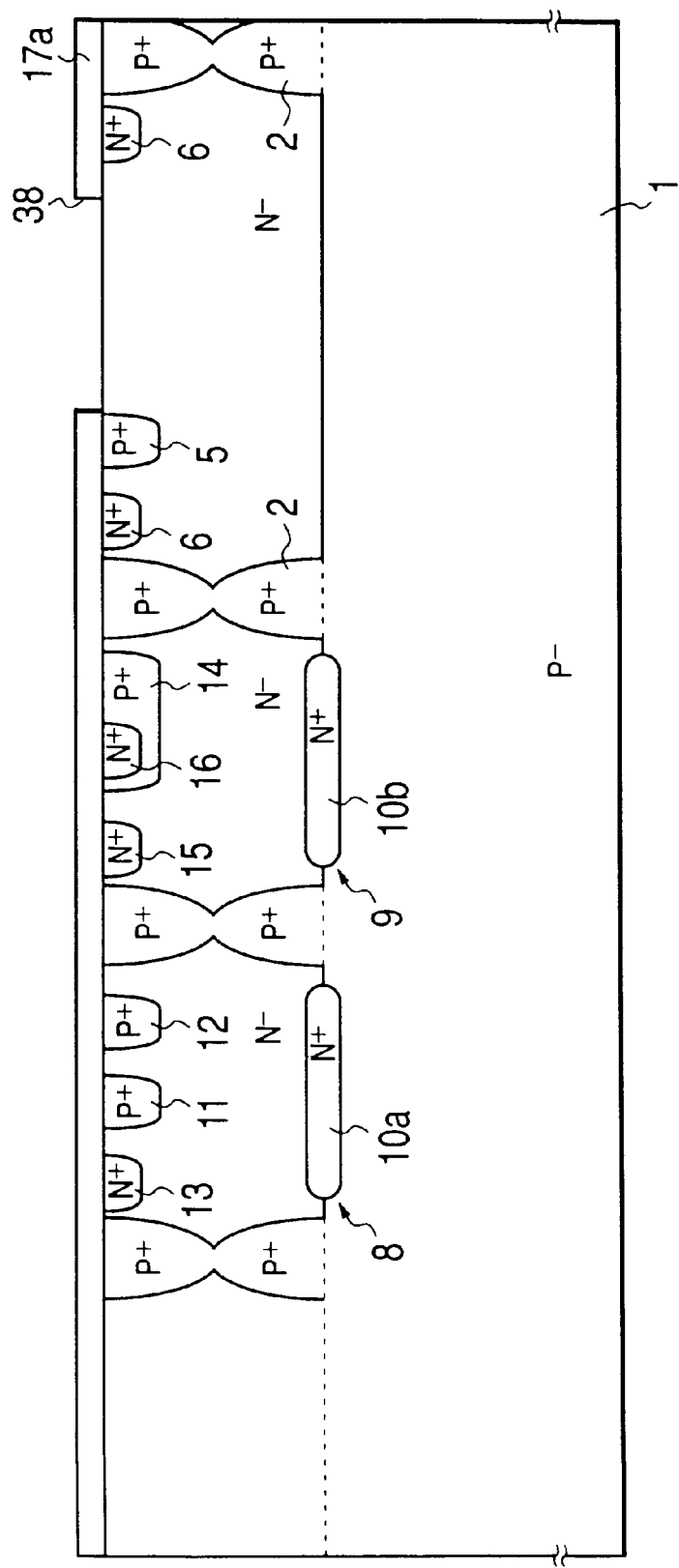
FIG. 4 is a cross-sectional view showing a manufacturing step of the photo sensor integrated circuit in accordance with the first embodiment of the present invention.
Figure 5:
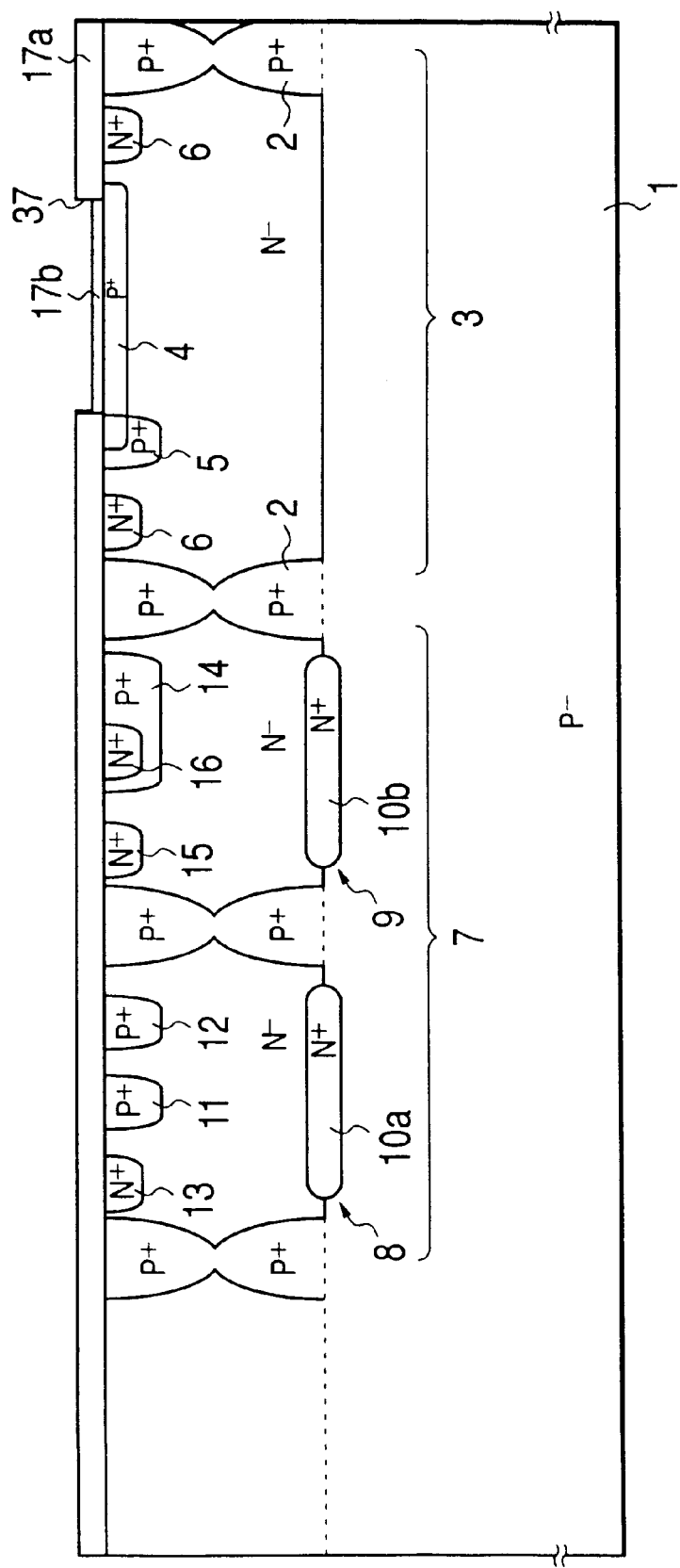
FIG. 5 is a cross-sectional view showing a manufacturing step of the photo sensor integrated circuit in accordance with the first embodiment of the present invention.

Thereafter, as shown in FIG. 4, a portion of the silicon oxide film 17a is partly removed by photo etching processing to form an opening portion 38 serving as a light receiving region. Thereafter, as shown in FIG. 5, an upper surface portion of the silicon substrate 1 exposed to the opening portion 38 is thermally oxidized, and the silicon oxide film (or the thermal oxide film) 17b having a thickness of 1,100 Å is formed in the opening portion 38 positioned on the upper surface of the silicon substrate 1. The silicon oxide film 17b denotes a first insulating film. Thereafter, the P⁺type region 4 is formed between the silicon oxide film 17b and the N⁻type epitaxial layer 1b by ion implantation and diffusing processing. Accordingly, the photo diode device 3 and the signal processing circuit device 7 are formed in the silicon substrate 1, and the silicon oxide film 17b is formed in the light receiving region of the photo diode device 3.

Figure 6:
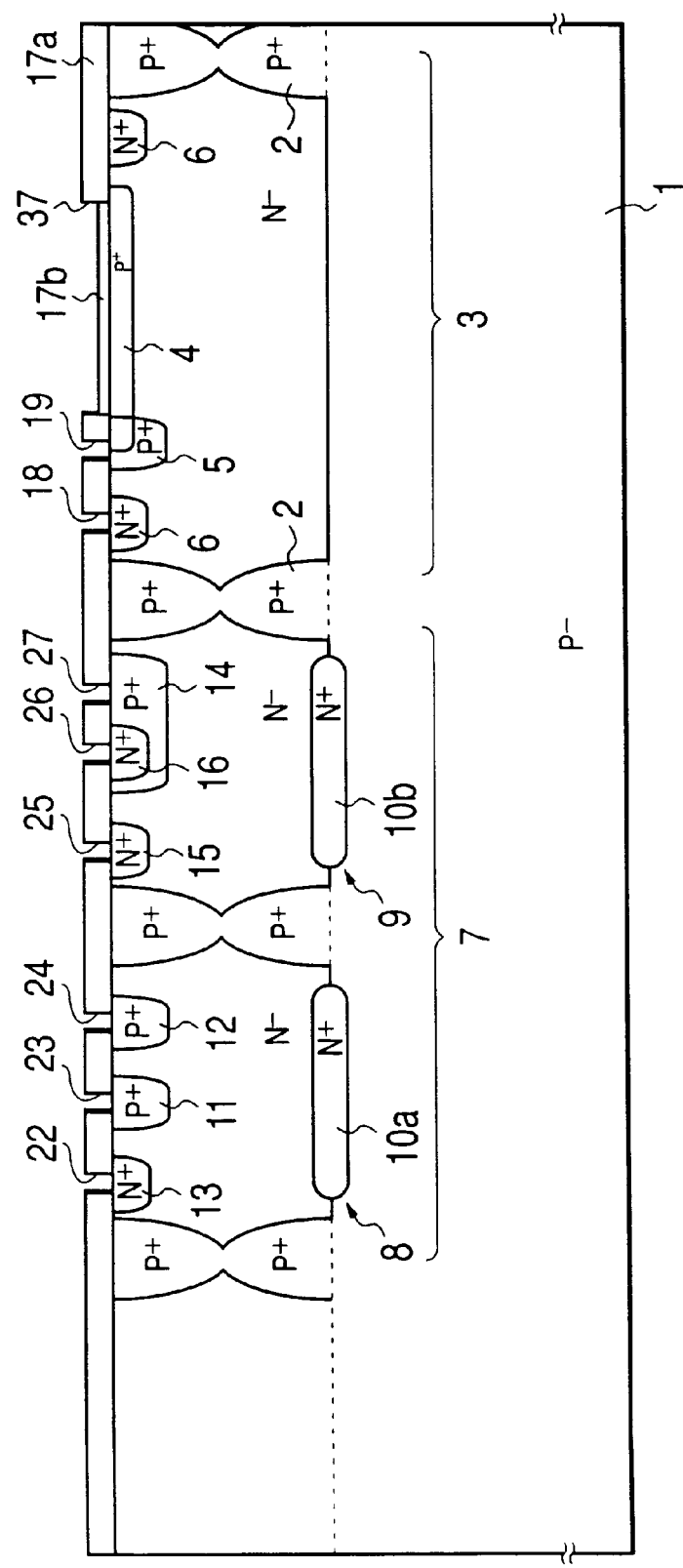
FIG. 6 is a cross-sectional view showing a manufacturing step of the photo sensor integrated circuit in accordance with the first embodiment of the present invention.
Figure 7:
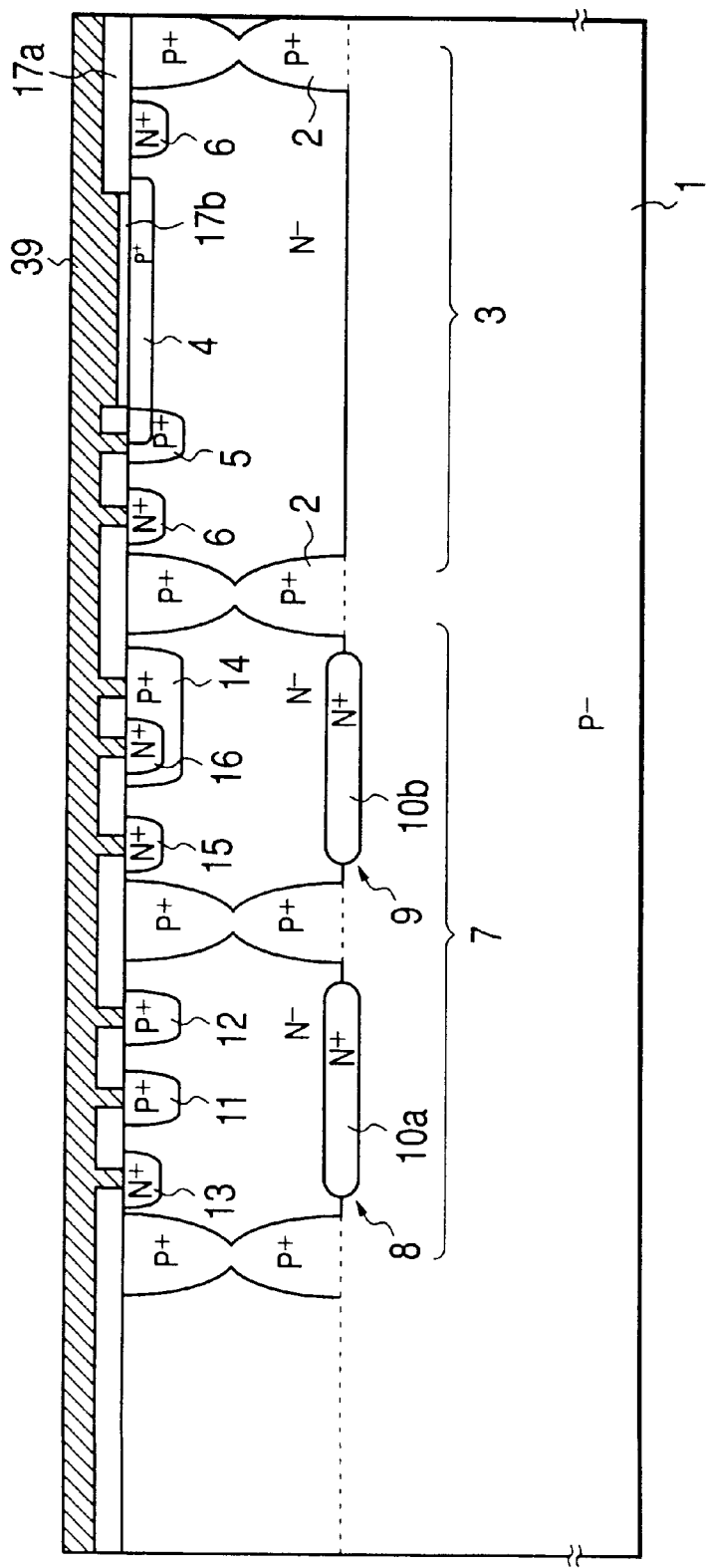
FIG. 7 is a cross-sectional view showing a manufacturing step of the photo sensor integrated circuit in accordance with the first embodiment of the present invention.
Figure 8:
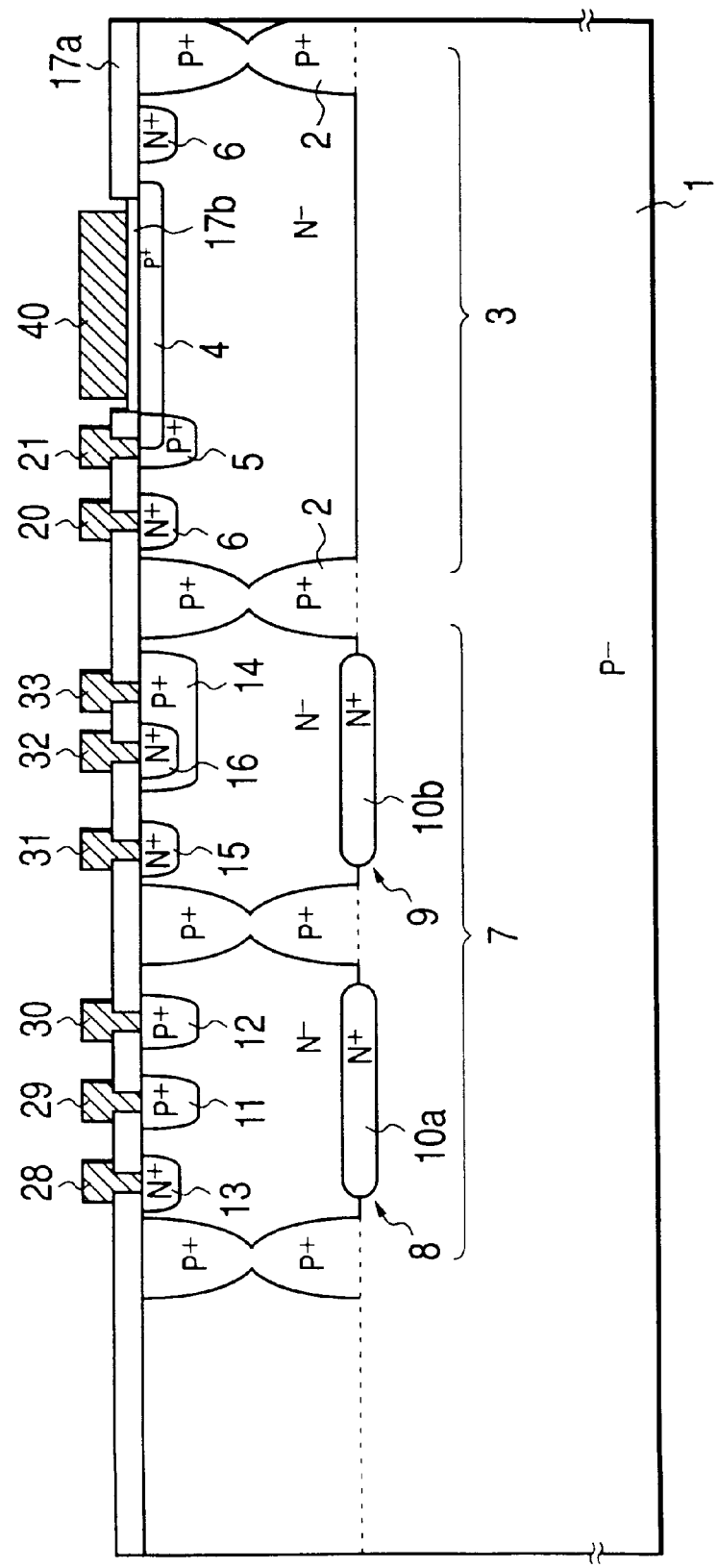
FIG. 8 is a cross-sectional view showing a manufacturing step of the photo sensor integrated circuit in accordance with the first embodiment of the present invention.

Thereafter, as shown in FIG. 6, a plurality of prescribed regions 18, 19 and 22 to 27 of the silicon oxide film 17a are opened by etching processing. Thereafter, as shown in FIG. 7, an aluminum thin film 39 denoting a first metallic film is deposited and formed on the silicon oxide films 17a and 17b. Thereafter, as shown in FIG. 8, the aluminum thin film 39 is patterned by photo etching processing (for example, wet etching using an etchant of phosphoric acid) to form the aluminum wires 20, 21 and 28–33. In this case, a portion of the aluminum thin film 39 positioned on the light receiving region of the photo diode device 3 is not etched and remains. The portion of the aluminum thin film 39 is identified by a symbol 40, and the aluminum thin film 40 is used as a protective film.

Figure 9:
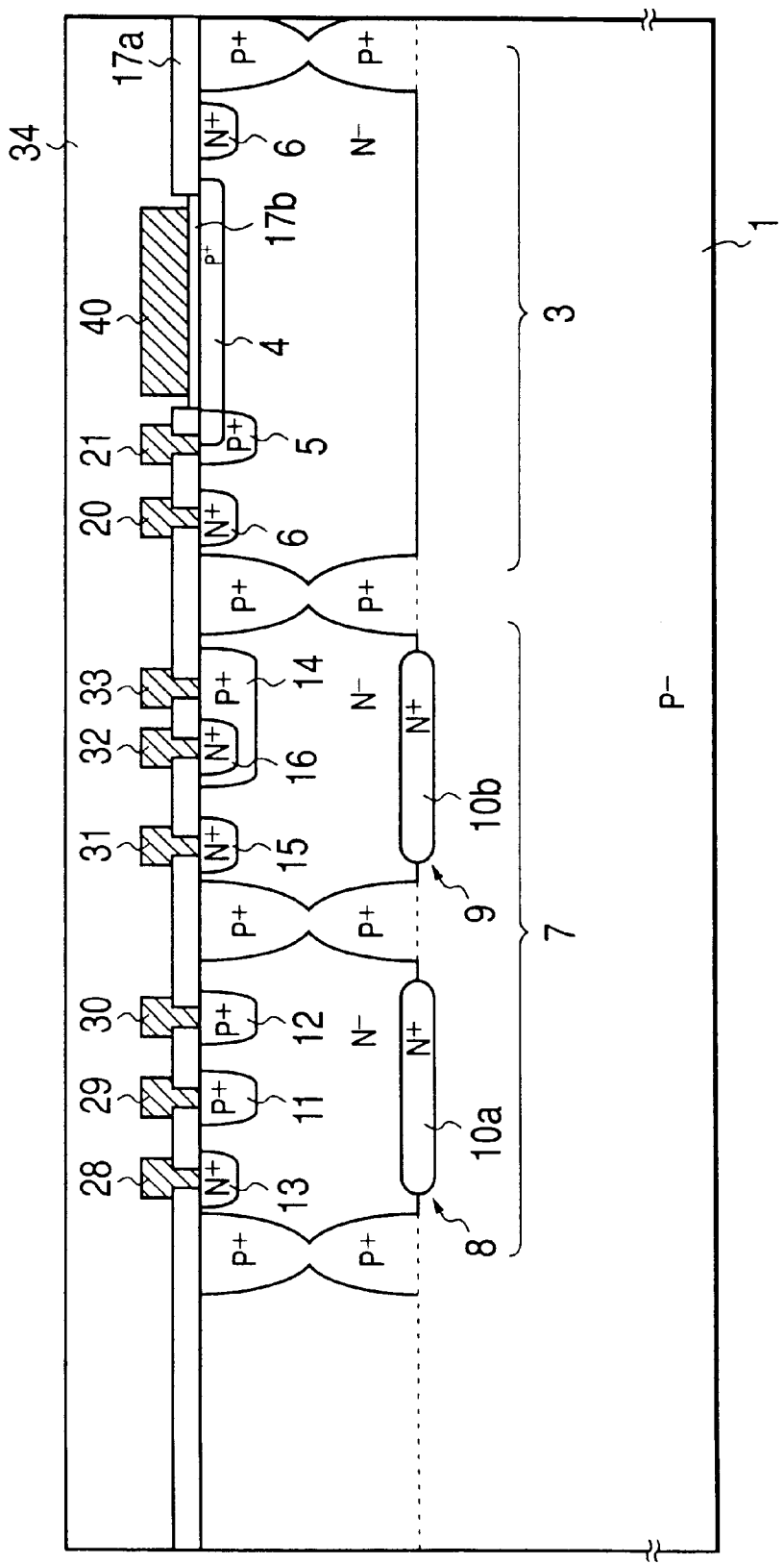
FIG. 9 is a cross-sectional view showing a manufacturing step of the photo sensor integrated circuit in accordance with the first embodiment of the present invention.
Figure 10:
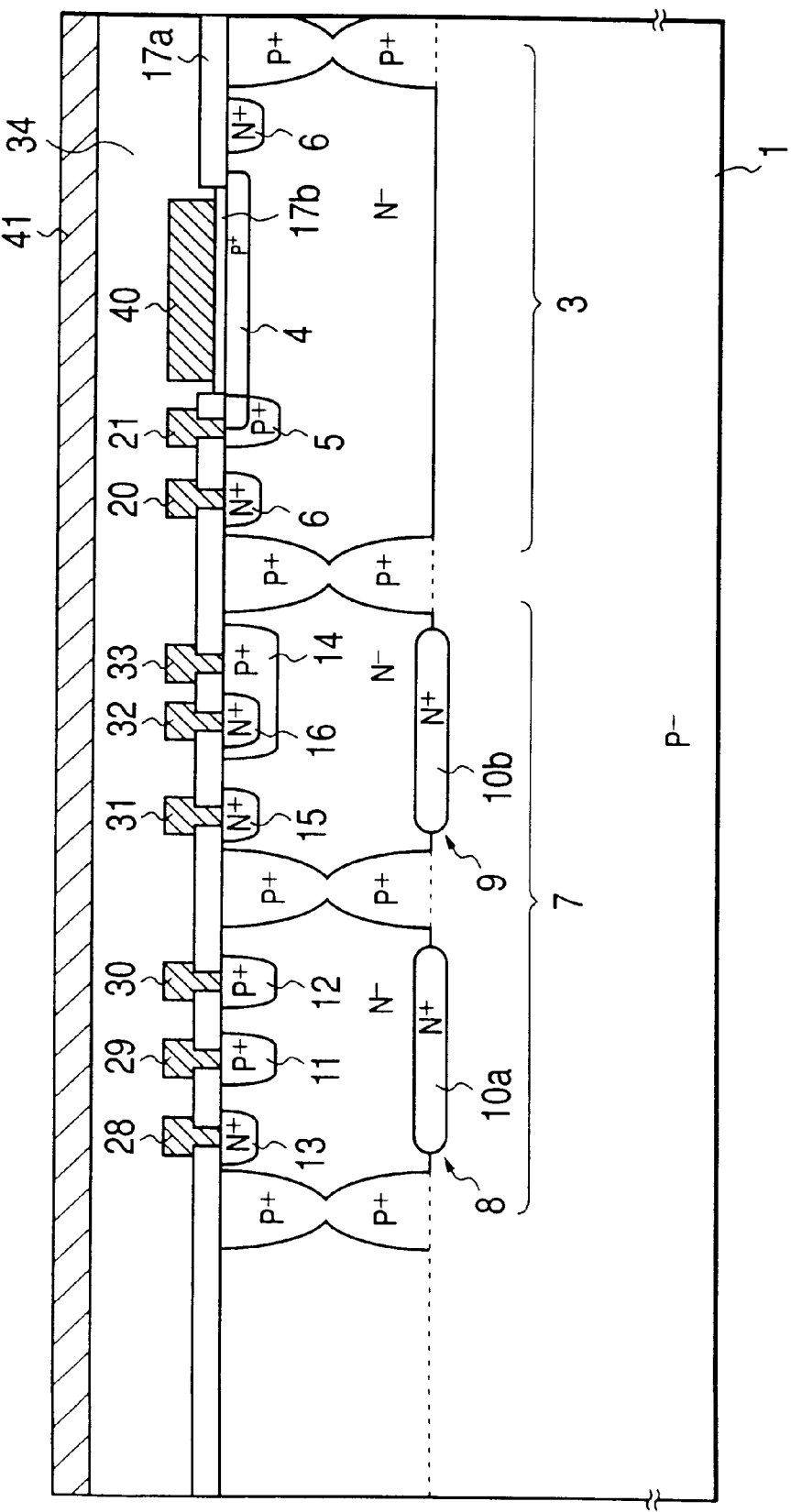
FIG. 10 is a cross-sectional view showing a manufacturing step of the photo sensor integrated circuit in accordance with the first embodiment of the present invention.
Figure 11:
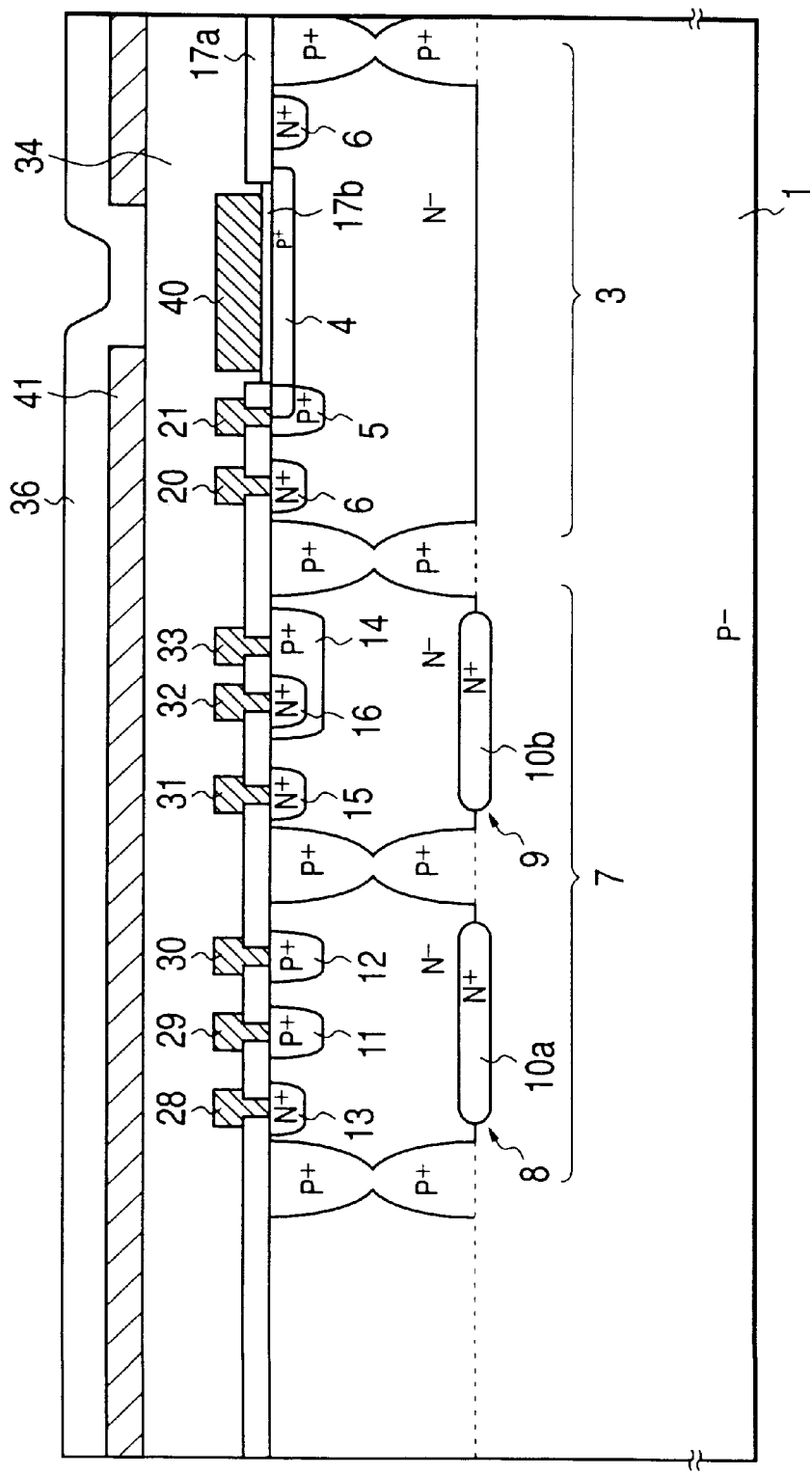
FIG. 11 is a cross-sectional view showing a manufacturing step of the photo sensor integrated circuit in accordance with the first embodiment of the present invention.

Thereafter, as shown in FIG. 9, the inter-layer insulating film 34 is deposited and formed on the silicon substrate 1 and the aluminum wires and thin films (20, 21, 28–33, 40). In detail, a silicon oxide film having a thickness of 400 nm and a silicon nitride film having a thickness of 500 nm are formed as the inter-layer insulating film 34 by the CVD method. Thereafter, as shown in FIG. 10, the aluminum thin film 41 functioning as a shielding film is deposited and formed on the inter-layer insulating film 34. Furthermore, as shown in FIG. 11, pattern etching is applied to the aluminum thin film 41. The aluminum thin film 41 positioned on the signal processing circuit device 7 serves as the shielding film, while the aluminum thin film 41 positioned on the light receiving region of the photo diode device 3 is removed through this pattern etching. Then, the surface protective film (silicon nitride film) 36 is deposited and formed on the aluminum thin film 41 and the light receiving region of the photo diode device 3.

Thereafter, the surface protective film 36, the inter-layer insulating film 34 and the aluminum thin film 40 are successively etched and removed at the region corresponding to the light receiving region of the photo diode device 3. At the same time, the surface protective flm 36 and the aluminum thin film 40 are etched and removed at the portions corresponding to the pads 37 in FIG. 1. In this case, the used mask pattern satisfies the previously described relationship relating to L.

In this manner, all films located on the silicon oxide film 17b are completely etched and removed at the region corresponding to the light receiving region of the photo diode device 3, while the shield film (aluminum thin film 40) satisfying the previously described L-related relationship is patterned.

The above-described embodiment has the following characteristic features.

The covered distance L of the aluminum thin film 35, i.e., overhang from the edge of the PNP bipolar transistor 8 (i.e., circuit element), is determined based on the ratio of the minimum current of the PNP bipolar transistor 8, which induces malfunction in the signal processing circuit device 7 under the solar radiation, to the current generated in the PNP bipolar transistor 8 when subjected to the solar radiation under a condition where the aluminum thin layer (shielding film) 35 is not provided. As described previously, 100,000 lux light irradiation is used as the pseudo-solar radiation.

Namely, the following inequality is the relationship needs to be satisfied according to the present invention.

$$L > \frac{\log\left(3.17 \times 10^{-6} \times \frac{Imal(\min)}{Io}\right) + 6.35}{-0.0704} \quad (2)$$

where L represents the covered distance ($\mu$m), Io represents the current generated in the PNP bipolar transistor 8 when subjected to 100,000 lux light irradiation under the condition where the aluminum thin layer 35 is not provided, and Imal(min) represents the minimum current of the PNP bipolar transistor 8 which induces malfunction in the signal processing circuit device 7 under the 100,000 lux light irradiation.

Accordingly, it becomes possible to prevent the signal processing circuit from malfunctioning even when a portion of the silicon substrate 1 not covered by the aluminum thin plate 35 causes a current flow due to photo carriers under strong light equivalent to 100,000 lux irradiation.

Other Embodiments

Other embodiments will be explained hereinafter.

The PNP bipolar transistor 8 can be replaced by an NPN transistor, a MOS transistor, a diode, or an impurity diffusion resistance element. When the NPN transistor is used as the circuit element, the above-described covered distance L of the shielding film is replaced by a covered distance L' measured from the edge of the P$^+$type region 14 to the opening end of the aluminum thin film 35, as shown in FIG. 2.

Figure 14:
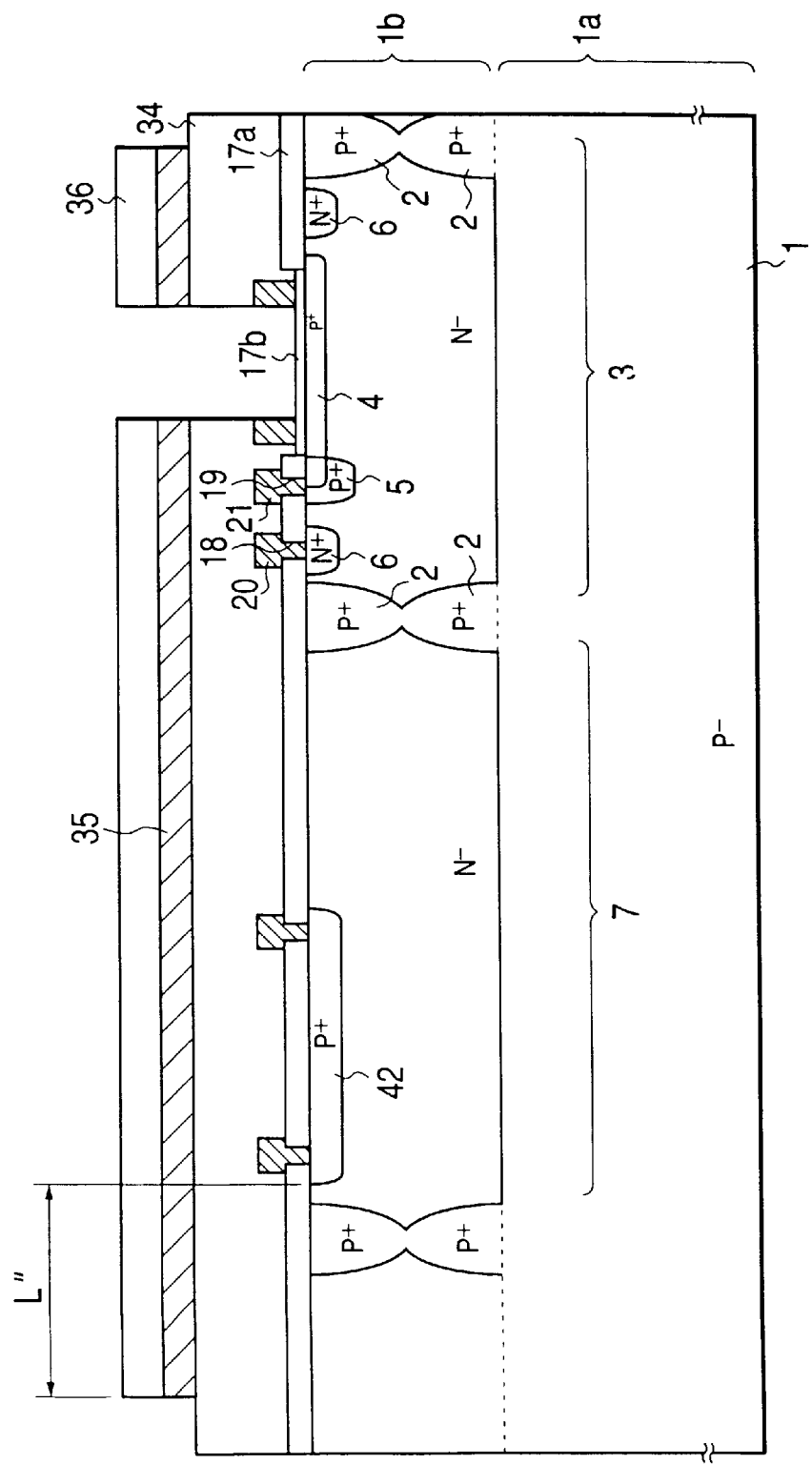
FIG. 14 is a cross-sectional view showing another photo sensor integrated circuit in accordance with another embodiment of the present invention.
Figure 15:
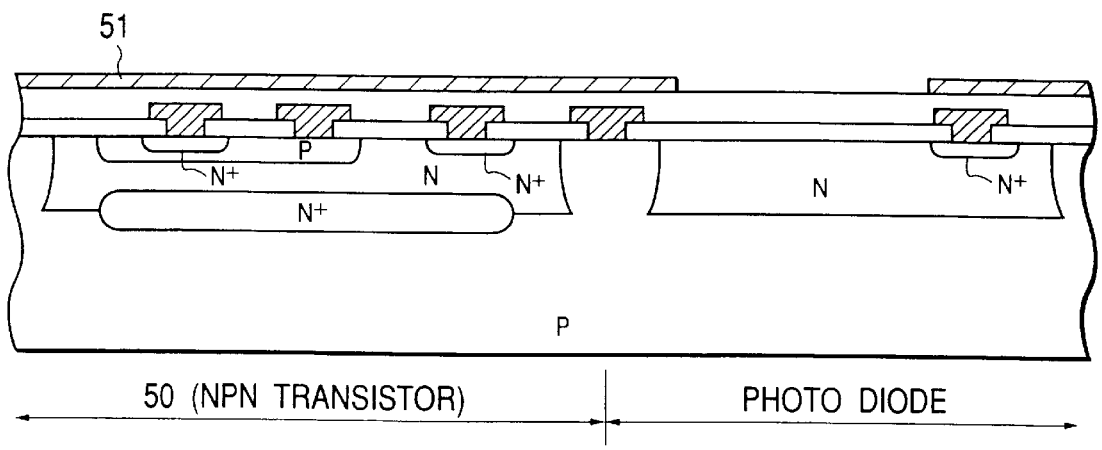
FIG. 15 is a cross-sectional view showing a conventional photo sensor integrated circuit.

Furthermore, when the impurity diffusion resistance element is used as the circuit element, the above-described covered distance L of the shielding film is replaced by a covered distance L" measured from the edge of the P$^+$ type region 42 to the edge of the aluminum thin film 35, as shown in FIG. 14.

In either case, the covered distance L' or L" is determined based on the ratio of Io to Imal(min), using the above-described relationship (2).

This invention may be embodied in several forms without departing from the spirit of essential characteristics thereof. The present embodiments as described are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A photo sensor integrated circuit comprising:
    photoelectric transfer means for converting received light into photoelectric current when subjected to solar radiation;
    signal processing means for processing the photoelectric current of said photoelectric transfer means; and
    a semiconductor substrate for integrating said photoelectric transfer means and said signal processing means as one chip component, said semiconductor substrate including a shielding film covering a circuit element that is part of said signal processing means;
    wherein an amount of the substrate covered by the shielding film L ($\mu$m) satisfies the following relationship so as to eliminate malfunction of the signal processing means which may be induced by diffusion of incoming light reaching from outside said shielding film $$L > \frac{\log(3.17 \times 10^{-6} \times Imal(\min)/Io) + 6.35}{-0.0704}$$

where Io represents a current generated in said circuit element when subjected to 100,000 lux light irradiation without said shielding film, which Imal(min) represents a minimum current of said circuit element which induces malfunction in said signal processing means under the 100,000 lux light irradiation.

2. The photo sensor integrated circuit in accordance with claim 1, wherein said covered amount L is larger than 0 and is smaller than a gap between said edge of said circuit element and a peripheral edge of said chip component.

3. The photo sensor integrated circuit in accordance with claim 2, wherein a plurality of electrode pads for outputting signals from said circuit element are provided along the peripheral edge of said chip component.

4. A photo sensor integrated circuit comprising:
    a semiconductor substrate for integrating components of the circuit;
    photoelectric transfer means for converting received light into photoelectric current, the photoelectric transfer means being formed on a first portion of a surface of the substrate;

signal processing means for processing the photoelectric current, the signal processing means (i) being formed on a second portion of the surface of the substrate, and (ii) integrated with the photoelectric transfer means, the photoelectric transfer means and the signal processing means forming a single chip component; and a shielding film formed on the surface of the substrate and for preventing a malfunction of the circuit when the circuit is subjected to solar radiation, the shielding film (i) covering the signal processing means, (ii) partially covering a remaining portion of the substrate, and (iii) preventing the malfunction of the signal processing means when the substrate is subjected to the solar radiation;

wherein an amount of the remaining portion of the substrate covered by the shielding film L ($\mu$m) satisfies the following relationship so as to eliminate the malfunction of the signal processing means which may be induced by diffusion of incoming light radiating from outside the shielding film $$L > \frac{\log(3.17 \times 10^{-6} \times Imal(\min)/Io) + 6.35}{-0.0704}$$

where Io represents a current generated in the circuit when subjected to 100,000 lux light irradiation without the shielding film, while Imal(min) represents a minimum current of a circuit element of the signal processing means which induces the malfunction in the signal processing means under the 100,000 lux light irradiation.

5. The photo sensor integrated circuit in accordance with claim 4, wherein the amount of the remaining portion of the substrate covered by the shielding film L is larger than 0 and is smaller than a gap between the edge of the circuit element and a peripheral edge of the chip component.

6. The photo sensor integrated circuit in accordance with claim 5, wherein a plurality of electrode pads for outputting signals from the circuit element are provided along the peripheral edge of the chip component.

* * * * *